US006188128B1

(12) United States Patent
Drevon

(10) Patent No.: US 6,188,128 B1
(45) Date of Patent: Feb. 13, 2001

(54) MONOBLOCK STRUCTURE FOR STACKED COMPONENTS

(75) Inventor: Claude Drevon, Toulouse (FR)

(73) Assignee: Alcatel, Paris (FR)

( * ) Notice: Under 35 U.S.C. 154(b), the term of this patent shall be extended for 0 days.

(21) Appl. No.: 09/020,413

(22) Filed: Feb. 9, 1998

(30) Foreign Application Priority Data

Feb. 10, 1997 (FR) .................................................. 97 01481

(51) Int. Cl.$^7$ .................................................. H01L 23/02
(52) U.S. Cl. ........................ 257/686; 438/109; 438/106; 333/246
(58) Field of Search ...................... 438/109, 107, 438/106; 257/686; 333/246, 247

(56) References Cited

U.S. PATENT DOCUMENTS

| 3,370,203 | * | 2/1968 | Kravitz et al. | 361/730 |
| 3,746,934 | | 7/1973 | Stein | 317/101 CM |
| 5,291,061 | | 3/1994 | Ball | 257/686 |
| 5,294,897 | * | 3/1994 | Notani et al. | 333/246 |
| 5,406,125 | * | 4/1995 | Johnson et al. | 257/774 |
| 5,832,598 | * | 11/1998 | Greenman et al. | 29/840 |
| 5,917,388 | * | 6/1999 | Tronche et al. | 333/246 |
| 5,953,588 | * | 9/1999 | Camien et al. | 438/106 |

FOREIGN PATENT DOCUMENTS

2688629A1   9/1993  (FR) .

OTHER PUBLICATIONS

Heritage Dictionary of the English Lanuage, New College Edition, William Morris (Editor), p. 429, 1976.*

Larcombe, et al., "Utilizing a Low Cost 3D Packaging Technology For Consumer Applications," IEEE Transactions on Consumer Electronics, vol. 41, No. 4, pp. 1095–1101, Nov. 1995.*

* cited by examiner

Primary Examiner—Wael Fahmy
Assistant Examiner—Hsien-Ming Lee
(74) Attorney, Agent, or Firm—Sughrue, Mion, Zinn, Macpeak & Seas, PLLC

(57) ABSTRACT

A monoblock structure comprises at least two stacked component levels, each component level comprising a layer of insulative material forming a component and encapsulation storey, at least one component and at least a first track a first end of which is connected to a connection point of the component. The structure further comprises at least one second track disposed laterally and a first end of which is connected to a second end of the first track. It additionally comprises a printed circuit forming a printed circuit storey and supporting at least one third track. A first end of the third track is coupled to a single input and/or output member one end of which is exposed on a face of the structure parallel to the component and printed circuit storeys and a second end of the third track is connected to a second end of the second track.

3 Claims, 2 Drawing Sheets

MONOBLOCK STRUCTURE FOR STACKED COMPONENTS

BACKGROUND OF THE INVENTION

1. Field of the Invention

The present invention concerns a compact monoblock structure for stacked components.

2. Description of the Prior Art

A prior art multilayer circuit, described in U.S. Pat. No. 5,101,323, for example, is obtained by molding a plurality of layers, or levels, of components in a single, typically parallelepiped-shape block. Each layer of components includes at least one component and one track making a connection with the component and extending towards one side of the parallelepiped-shape block. Connections between levels, typically metallized tracks, are formed on the sides of the parallelepiped-shape block between the components of the various levels by etching the previously metallized block.

Because it is advantageous to use a single side of the block to carry the high-frequency or low-frequency component input and/or output connection points, this solution has the disadvantage of requiring the tracks to extend around one edge of the block. This implies technical problems including the difficulty of etching the track at the edge, the fact that the etching is more fragile at this edge, etc.

The invention aims to remedy this disadvantage by providing a monoblock structure for stacked components that does not require the tracks for making connections between the input and/or output connection points and the components to extend around an edge.

Another objective of the invention is to provide a process for fabricating a monoblock structure of the above kind.

SUMMARY OF THE INVENTION

To this end, the invention consists in a monoblock structure comprising at least two stacked component levels, each component level comprising:

a layer of insulative material forming a component and encapsulation storey,
  at least one component, and
  at least a first track a first end of which is connected to a connection point of the component, the structure further comprising at least one second track disposed laterally and a first end of which is connected to a second end of the first track and printed circuit means forming a printed circuit storey and carrying at least one third track, a first end of the third track being coupled to a single input and/or output member one end of which is exposed on a face of the structure parallel to the component and printed circuit storeys and a second end of the third track being connected to a second end of the second track.

In a first variant, the signal input and/or output member is a pin member housed in a metallized hole in the printed circuit.

In another variant, the signal input and/or output member is a waveguide member carrying at least one grounding pin on one of its edges, the pin is housed in a metallized hole in the printed circuit means that forms one end of a grounding track and the first end of the third track is coupled to the waveguide.

The present invention also covers a process for fabricating a monoblock stacked component structure. The process comprises the steps of:

stacking at least two component levels, each component level comprising:

a layer of insulative material forming a component and encapsulation storey,
  at least one component, and
  at least one first track a first end of which is connected to a connection point of the component, molding the at least two stacked component levels and printed circuit means forming part of a printed circuit storey and supporting at least one third track that is coupled to a signal input and/or output member upstanding orthogonally to the printed circuit means to form a monoblock structure preform, cutting the monoblock structure preform to expose a section of the signal input and/or output member and an edge of the third track, metallizing the resulting cut monoblock structure preform, etching at least a second face of the metallized cut monoblock structure preform to form a second lateral track between a second end of the first track and a second end of the third track.

For fabricating a structure with pins, the process further comprises the steps of:

etching a first face of the metallized cut monoblock structure preform on which the section of the pin means is exposed to form a metallized area localized in the section, and growing a bump on the metallized area.

The step of growing a bump on the metallized area is typically an electrolytic growth step.

Other features and advantages of the present invention will become more clearly apparent from a reading of the following description with reference to the corresponding appended drawings.

DETAILED DESCRIPTION OF THE PREFERRED EMBODIMENTS

Figure 1:
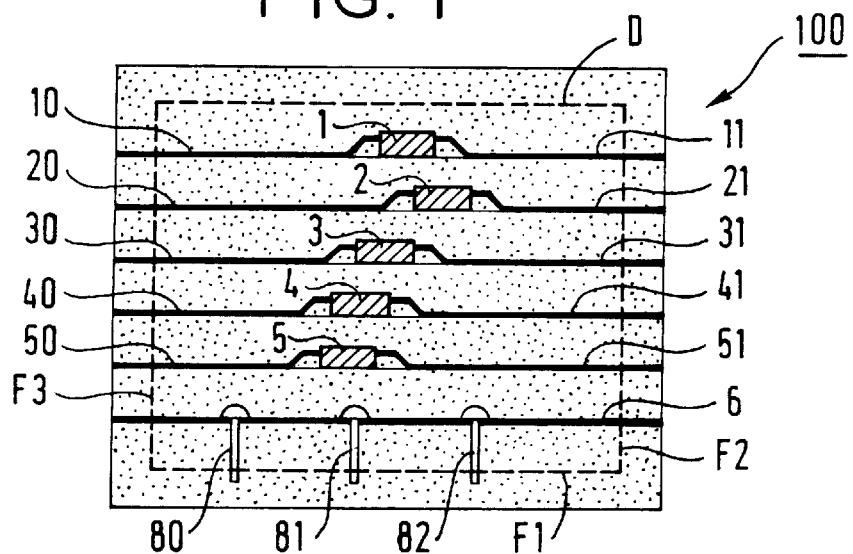
FIG. 1 shows a sectional view of a preform for a stacked component structure in accordance with the invention.

Referring to FIG. 1, a monoblock structure preform 100 from which a monoblock structure in accordance with the invention is formed comprises at least two stacked levels, or storeys, of components. Each component level comprises a layer of insulative material R, for example in the form of a hardened resin encapsulating at least one component 1, 2, 3, 4 or 5 and at least one track associated with the component(s) of the level concerned. In FIG. 1, for example, the component 4 and the tracks 40 and 41 encapsulated in the resin R together form one component level. For each component level one of the two ends of the tracks 40 and 41 of that storey is connected to a connection point of the component 4. For example, the components 1, 2, 3, 4 and 5 of the five levels represented are microwave components and the pairs of tracks 10–11, 20–21, 30–31, 40–41 and 50–51 respectively associated with those components are coplanar lines.

Figure 2:
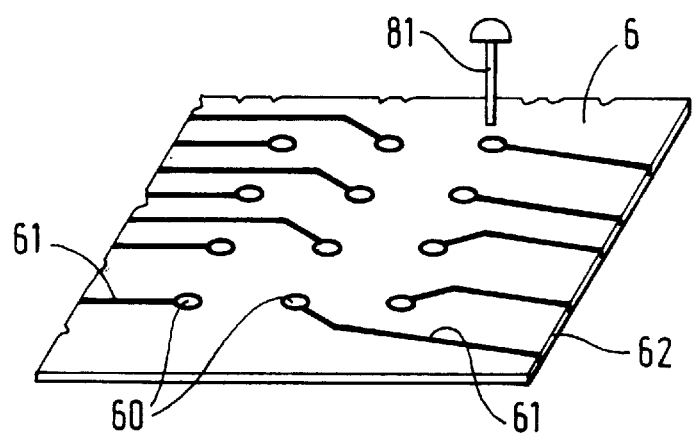
FIG. 2 is a perspective view of a printed circuit molded into the preform from FIG. 1.
Figure 5:
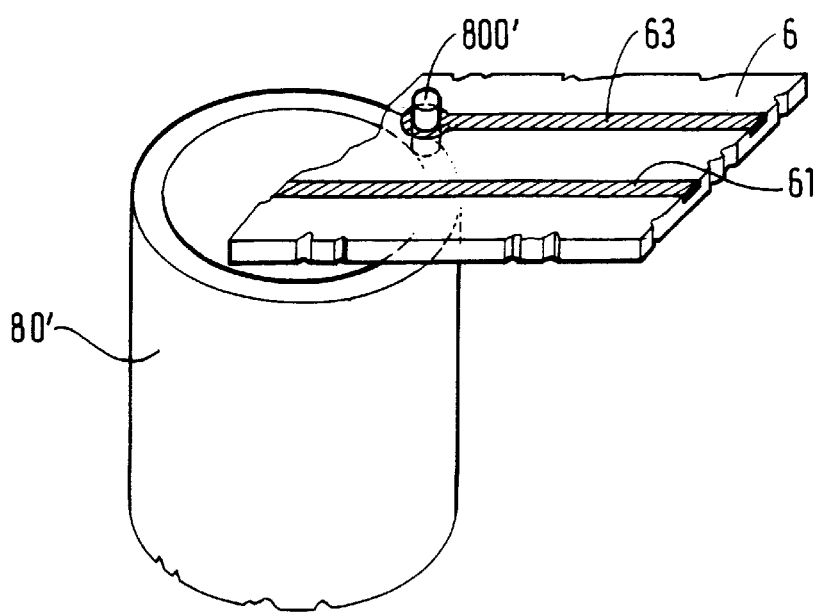
FIG. 5 shows a perspective view of a variant signal input and/or output member in the form of a waveguide that is integrated into the monoblock structure of the invention.

Referring to FIGS. 1 and 2, in accordance with the invention, the monoblock structure preform 100 from which the structure in accordance with the invention is formed further comprises a printed circuit storey including a printed circuit 6 encapsulated in the resin. The printed circuit carries at least one printed circuit track 61, a first end 60 of this printed circuit track being coupled to a single input and/or output member 80, 81 or 82 one end of which is exposed on a face F1 of the structure parallel to the component and/or printed circuit storey. For example, the signal input and/or output member 80, 81 or 82 is in the form of a pin with a head housed in and brazed into a metallized hole in the printed circuit 6 at the end of the track 61. Note that other embodiments of the signal input and/or output member 80, 81 or 82 are feasible with one end exposed on a face F1 of the structure parallel to the component and printed circuit storeys. In the embodiment shown in FIG. 5, the signal input and/or output member is a waveguide 80' carrying at least one grounding pin 800' on one edge, for example. The pin 800' is housed in a metallized hole in a grounding track 63 on the printed circuit 6. A track 61 couples the waveguide. The track 61 extends above the waveguide from which it is separated by the substrate of the printed circuit 6.

Figure 4:
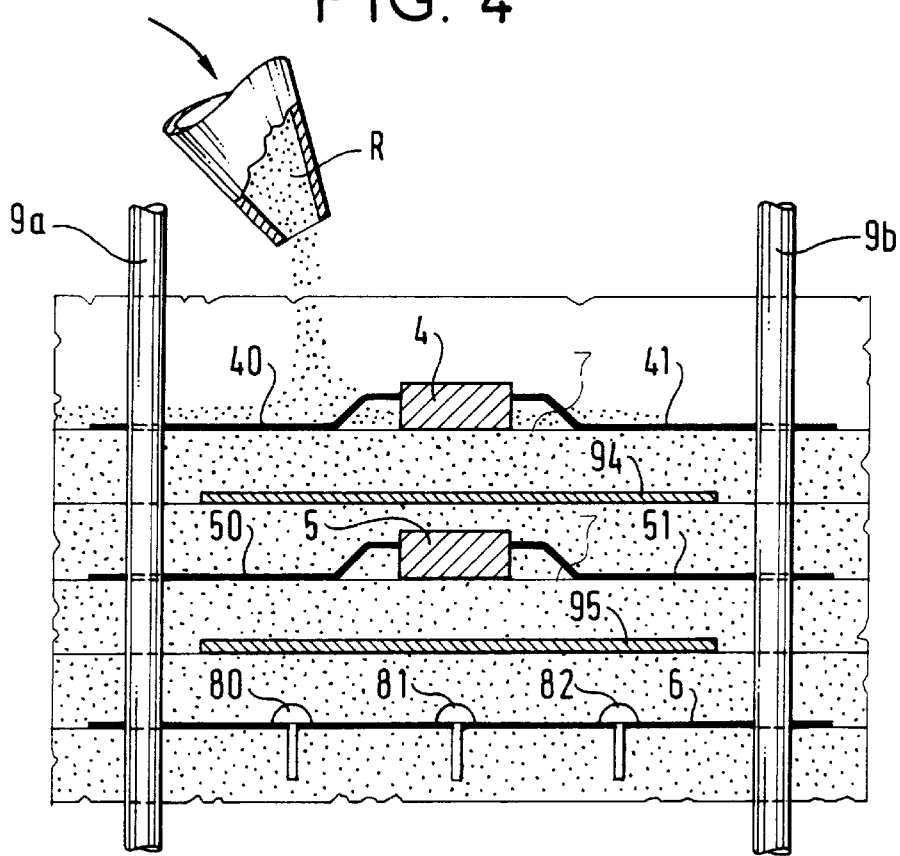
FIG. 4 is a sectional view of the module from FIG. 1 during fabrication.

A process for fabricating a monoblock structure preform as shown in FIG. 1 is described next with reference to FIG. 4. This process uses a parallelepiped-shape mold (not shown) with guide means, for example two elongate rods 9a and 9b, upstanding from a closed bottom. Resin is placed in the bottom of the mold. The printed circuit 6 with each signal input/output member 80, 81, 82 or 80' upstanding orthogonally on it is placed on the surface of the bottom layer of resin, guided by the two rods 9a and 9b, the signal input and/or output members penetrating into the resin, which has not yet been hardened. The preform is then formed by alternately placing in the mold resin R and boards 7 supporting the components 5, 4 and the associated tracks 50–51, 40–41. After stacking the required number of component storeys, the resulting structure, which is parallelepiped-shape, is removed from the mold. A grounding plane 95, 94 can be inserted during molding to separate two component storeys to prevent mutual interference between components in two adjacent storeys, especially if the components are microwave components.

In the variant in which each signal input and/or output member is in the form of a pin, each pin is inserted into a corresponding metallized hole 60 in the track 61 of the printed circuit 6 from one side of the printed circuit and in the variant in which each signal input/output member is in the form of a waveguide each grounding pin 800' is inserted into a corresponding metallized hole in the track 63 of the printed circuit 6 from the other side of the printed circuit. In this second variant the disposition of the grounding tracks 63 and the coupling tracks 61 is adapted to suit the geometry of the waveguide 80'.

The preform from FIG. 1 is then transformed in the following manner. First, it is cut along the dashed lines D shown in FIG. 1 to expose the respective sections of the signal input and/or output members 80, 81, 82 or 80' on the face F1, the edges of the tracks 10–11, 20–21, 30–31, 40–41 and 50–51 on each component level and the edges 62 of the tracks 61 of the printed circuit 6 on lateral faces F2, F3.

In the waveguide variant, this is followed by metallizing the lateral faces F2 and F3 on which the edges of the tracks 10–11, 20–21, 30–31, 40–41 and 50–51 of each component level and the edges 62 of the tracks 61 of the printed circuit 6 are exposed. These faces, on which the edges 62 of the tracks 61 of the printed circuit 6 are exposed before metallization, are then etched to form each connecting track between each of the edges 62 and one end of a track 10, 11, 20, 21, 30, 31, 40, 41, 50, 51 of a component storey and each lateral connecting track between the tracks 10, 20, 30, 40 and 50 and between the tracks 11, 21, 31, 41 and 51. This etching step consists in laser etching the uniform metallized layer on the face F2 or F3 concerned, for example.

Figure 3:
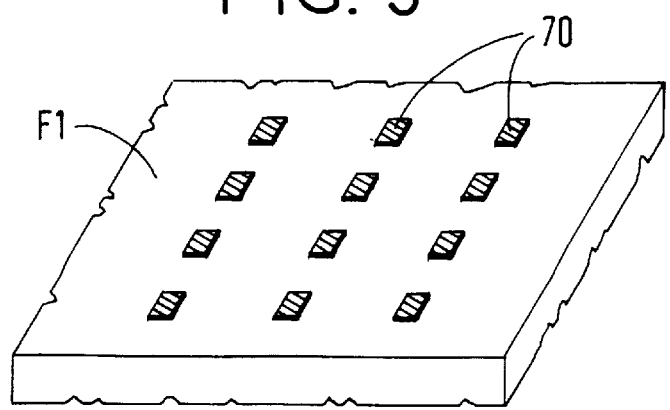
FIG. 3 is a bottom view of the monoblock structure preform from FIG. 1 after it has been cut and etched.

In the pin variant, the resulting cut preform is metallized all over by depositing a metallized layer onto its surface. Then, as shown in FIG. 3, the face F1, on which the sections of the pin members 80, 81 and 82 are exposed before metallization, is etched to form a metallized area 70 in contact with each of the pin member sections. A bump is grown for each of these metallized areas 70, for example electrolytically. Note that the areas 70 are all electrically interconnected via the tracks 61 of the printed circuit 6 and the metallized faces of the metallized cut preform.

The faces F2 and F3, on which the edges 62 of the tracks 61 of the printed circuit 6 are exposed before metallization, are then etched for form each connecting track between each of the edges 62 and one end of a track 10, 11, 20, 21, 30, 31, 40, 41, 50, 51 of a component storey and each lateral connecting track between the tracks 10, 20, 30, 40 and 50 and between the tracks 11, 21, 31, 41 and 51. This etching step consists in laser etching the uniformly metallized layer of the face concerned, for example.

What is claimed is:

1. A monoblock structure comprising:
    a plurality of component levels arranged in a stack, each component level having
        (1) a component,
        (2) a first track extending from said component, and
        (3) a layer of insulative material encapsulating said component and said first track to form a solid body;
    a second track connected to at least one of said first tracks of said component levels; and
    a printed circuit arranged in said stack, and carrying a third track, said third track having
        (1) a first end coupled to an input and/or output member exposed on a face of said stack parallel to said component levels, and
        (2) a second end connected to said second track.

2. A monoblock structure comprising:
    a plurality of component levels arranged in a stack, each component level having
        (1) a component,
        (2) a first track extending from said component, and
        (3) a layer of insulative material encapsulating said component and said first track to form a solid body;
    a second track connected to at least one of said first tracks of said component levels; and
    a printed circuit arranged in said stack, and carrying a third track, said third track having
        (1) a first end coupled to an input and/or output member exposed on a face of said stack parallel to said component levels, and
        (2) a second end connected to said second track,
    wherein said signal input and/or output member is a pin extending through a metallized hole in said printed circuit.

3. A monoblock structure comprising:
    a plurality of component levels arranged in a stack, each component level having
        (1) a component,
        (2) a first track extending from said component, and (3) a layer of insulative material encapsulating said component and said first track to form a solid body;

a second track connected to at least one of said first tracks of said component levels; and a printed circuit arranged in said stack, and carrying a third track, said third track having
  (1) a first end coupled to an input and/or output member exposed on a face of said stack parallel to said component levels, and
  (2) a second end connected to said second track, wherein said signal input and/or output member is a waveguide member carrying a grounding pin, said grounding pin extends through a metallized hole in said printed circuit that forms one end of a grounding track, and said first end of said third track is coupled to said waveguide.

* * * * *